United States Patent
Harada et al.

(10) Patent No.: US 9,356,100 B2
(45) Date of Patent: May 31, 2016

(54) SEMICONDUCTOR DEVICE

(71) Applicants: FUJI ELECTRIC CO., LTD., Kawasaki-shi, Kanagawa (JP); NATIONAL INSTITUTE OF ADVANCED INDUSTRIAL SCIENCE AND TECHNOLOGY, Tokyo (JP)

(72) Inventors: Shinsuke Harada, Tsukuba (JP); Noriyuki Iwamuro, Tsukuba (JP); Yasuyuki Hoshi, Matsumoto (JP); Yuichi Harada, Matsumoto (JP)

(73) Assignees: FUJI ELECTRIC CO., LTD., Kawasaki-shi (JP); NATIONAL INSTITUTE OF ADVANCED INDUSTRIAL SCIENCE, Tsukuba-shi (JP)

( * ) Notice: Subject to any disclaimer, the term of this patent is extended or adjusted under 35 U.S.C. 154(b) by 0 days.

(21) Appl. No.: 14/397,106

(22) PCT Filed: Mar. 18, 2013

(86) PCT No.: PCT/JP2013/057742
§ 371 (c)(1),
(2) Date: Oct. 24, 2014

(87) PCT Pub. No.: WO2013/161448
PCT Pub. Date: Oct. 31, 2013

(65) Prior Publication Data
US 2015/0069415 A1 Mar. 12, 2015

(30) Foreign Application Priority Data
Apr. 27, 2012 (JP) ................. 2012-104229

(51) Int. Cl.
| H01L 29/78 | (2006.01) |
| H01L 29/16 | (2006.01) |
| H01L 29/08 | (2006.01) |
| H01L 29/36 | (2006.01) |

(52) U.S. Cl.
CPC ........ *H01L 29/1608* (2013.01); *H01L 29/0873* (2013.01); *H01L 29/0878* (2013.01); *H01L 29/36* (2013.01); *H01L 29/78* (2013.01); *H01L 29/7802* (2013.01)

(58) Field of Classification Search
CPC ......... H01L 29/1608; H01L 29/7802–29/7815
See application file for complete search history.

(56) References Cited

U.S. PATENT DOCUMENTS

| 2006/0057796 A1 | 3/2006 | Harada et al. | |
| 2010/0012951 A1* | 1/2010 | Yatsuo | H01L 29/086 257/77 |
| 2012/0007104 A1* | 1/2012 | Wada | H01L 21/0485 257/77 |

FOREIGN PATENT DOCUMENTS

| JP | 2008-98536 A | 4/2008 |
| JP | 2011-165861 A | 8/2011 |
| WO | 2004/036655 A1 | 4/2004 |

OTHER PUBLICATIONS

Notification of Transmittal of Translation of the International Preliminary Report on Patentability (Chapter I or Chapter II) (Form PCT/IB/338) of the International Application No. PCT/JP2013/057742 mailed Oct. 30, 2014 with Form PCT/IPEA/409. (6 pages).
International Search Report dated Jun. 18, 2013 issued in corresponding application no. PCT/JP2013/057742.

* cited by examiner

*Primary Examiner* — Daniel Shook
(74) *Attorney, Agent, or Firm* — Westerman, Hattori, Daniels & Adrian, LLP

(57) ABSTRACT

An n-type SiC layer is formed on a front face of an $n^+$-type SiC substrate and plural p-type regions are selectively formed inside the n-type SiC layer. A p-type SiC layer is formed covering the surfaces of the n-type SiC layer and the p-type regions. An n-type region is formed inside the p-type SiC layer to be connected to the n-type SiC layer. An $n^+$-type source region and a $p^+$-type contact region are formed inside the p-type SiC layer, positioned away from the n-type region and in contact with each other. The n-type region in the p-type SiC layer is formed such that the width $L_{JFET}$ of the n-type region is within a range from 0.8 μm to 3.0 μm and the impurity concentration of the n-type region is greater than $1.0\times10^{16}$ cm$^{-3}$ and less than or equal to $5.0\times10^{16}$ cm$^{-3}$.

3 Claims, 2 Drawing Sheets

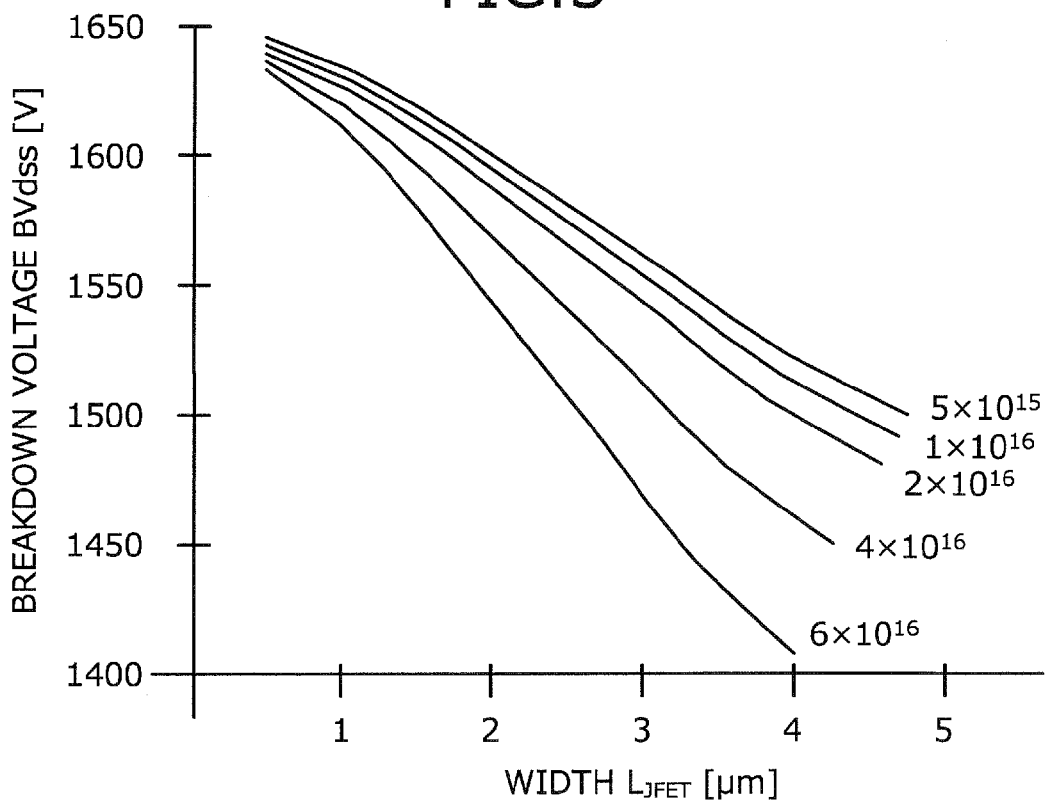
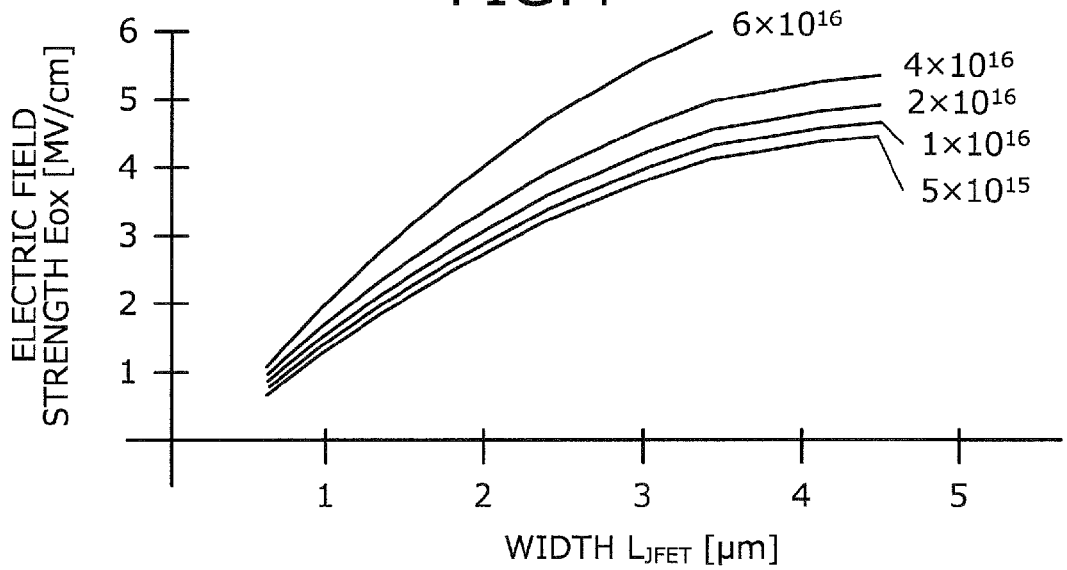

SEMICONDUCTOR DEVICE

TECHNICAL FIELD

The present invention relates to a semiconductor device formed on a silicon carbide substrate, and more particularly to a vertical semiconductor device.

BACKGROUND ART

A vertical MOSFET (a metaloxide semiconductor field effect transistor) is known as a switching device that uses a silicon carbide (hereinafter, referred to as "SiC") substrate (see, e.g., Patent Document 1 below). In the vertical MOSFET in Patent Document 1 below, a p-type SiC layer is deposited to be a base region on an $n^+$-type SiC substrate that is a drift region. Inside the p-type SiC layer, an $n^+$-type source region, and an n-type region penetrating the p-type SiC layer in the depth direction and connected to the $n^+$-type SiC substrate are selectively formed away from each other. A gate electrode is formed through a gate insulating film, on the surface of a portion between the $n^+$-type source region and the n-type region of the p-type SiC layer.

Patent Document 1: Published Japanese-Translation of PCT Application, Publication No. 2004-036655

DISCLOSURE OF INVENTION

Problem to be Solved by the Invention

Nonetheless, when the impurity concentration and the width are not optimized of the n-type region formed inside the p-type SiC layer, simultaneous establishment of the ON-resistance property and the breakdown voltage property in optimal states is difficult. A trade-off relation exists between the ON-resistance property and the breakdown voltage property and, when the ON-resistance is reduced, the breakdown voltage is reduced and, on the contrary, when the breakdown voltage is increased, the ON-resistance is increased. Therefore, a problem arises in that the device properties cannot be obtained such that the ON-resistance property and the breakdown voltage property are both excellent.

In a case where the width is not optimized of the n-type region formed inside the p-type SiC layer, when high voltage is applied to the drain electrode, a high electric field is applied to the gate insulating film, whereby the gate insulating film may be broken down or the reliability of the gate insulating film may be significantly degraded. In particular, when the MOSFET is turned off, high voltage is continuously applied to the drain electrode and therefore, a high electric field tends to be applied to the gate insulating film. Therefore, another problem arises in that the above problem occurring in the gate insulating film tends to arise.

To solve the above problems related to the conventional techniques, an object of the present invention is to provide a semiconductor device that can facilitate reduction of the ON-resistance and an increase of the breakdown voltage. To solve the above problems related to the conventional techniques, another object of the present invention is to provide a semiconductor device that can improve the dielectric breakdown tolerance of the gate insulating film and thereby, improve the reliability of the gate insulating film.

Means for Solving Problem

To solve the problems above and achieve an object of the present invention, a semiconductor device includes a first conductivity type silicon carbide substrate; a first conductivity type silicon carbide layer formed on a surface of the first conductivity type silicon carbide substrate, and having an impurity concentration that is lower than that of the first conductivity type silicon carbide substrate; a second conductivity type region selectively formed inside the first conductivity type silicon carbide layer; a second conductivity type silicon carbide layer formed on surfaces of the first conductivity type silicon carbide layer and the second conductivity type region, and having an impurity concentration that is lower than that of the second conductivity type region; a first conductivity type region selectively formed inside the second conductivity type silicon carbide layer, penetrating the second conductivity type silicon carbide layer in a depth direction, and in contact with the first conductivity type silicon carbide layer; a first conductivity type source region formed inside the second conductivity type silicon carbide layer; a second conductivity type high-concentration region formed inside the second conductivity type silicon carbide layer and disposed on a side opposite to that of the first conductivity type region of the first conductivity type source region; a source electrode electrically connected to the second conductivity type high-concentration region and the first conductivity type source region; a gate electrode formed through a gate insulating film on a surface of a portion between the first conductivity type source region and the first conductivity type region in the second conductivity type silicon carbide layer, spanning from the first conductivity type source region to the first conductivity type region; and a drain electrode formed on a back face of the first conductivity type silicon carbide substrate. The impurity concentration of the first conductivity type region is greater than $1.0 \times 10^{16}$ cm$^{-3}$ and less than or equal to $5.0 \times 10^{16}$ cm$^{-3}$, and the width of the first conductivity type region is within a range from 0.8 μm to 3.0 μm.

In the invention above, in the semiconductor device according to the present invention, the impurity concentration of the first conductivity type region is within a range from $2.0 \times 10^{16}$ cm$^{-3}$ to $4.0 \times 10^{16}$ cm$^{-3}$, and the width of the first conductivity type region is within a range from 1.0 μm to 2.0 μm.

According to the present invention described above, the ON-resistance and the breakdown voltage can be established concurrently, whereby a device that has a low ON-resistance while having high breakdown voltage can be obtained by optimizing the design of the impurity concentration and the width of the first conductivity type region formed in the second conductivity type silicon carbide layer. Even when high voltage is applied to the drain electrode, no high electric field is applied to the gate insulating film on the first conductivity type region and therefore, the dielectric breakdown tolerance of the gate insulating film can be improved. Consequently, the reliability of the gate insulating film is improved.

Effect of the Invention

According to the semiconductor device according to the present invention, an effect is achieved in that reduction of the ON-resistance and an increase of the breakdown voltage can be facilitated. According to the semiconductor device of the present invention, an effect is achieved in that the dielectric breakdown tolerance of the gate insulating film can be improved, thereby improving the reliability of the gate insulating film.

BRIEF DESCRIPTION OF DRAWINGS

FIG. 3 is a graph of a breakdown voltage property of the MOSFET according to the embodiment of the present invention; and FIG. 4 is a graph of electric field strength of the MOSFET according to the embodiment of the present invention.

BEST MODE(S) FOR CARRYING OUT THE INVENTION

Figure 1:
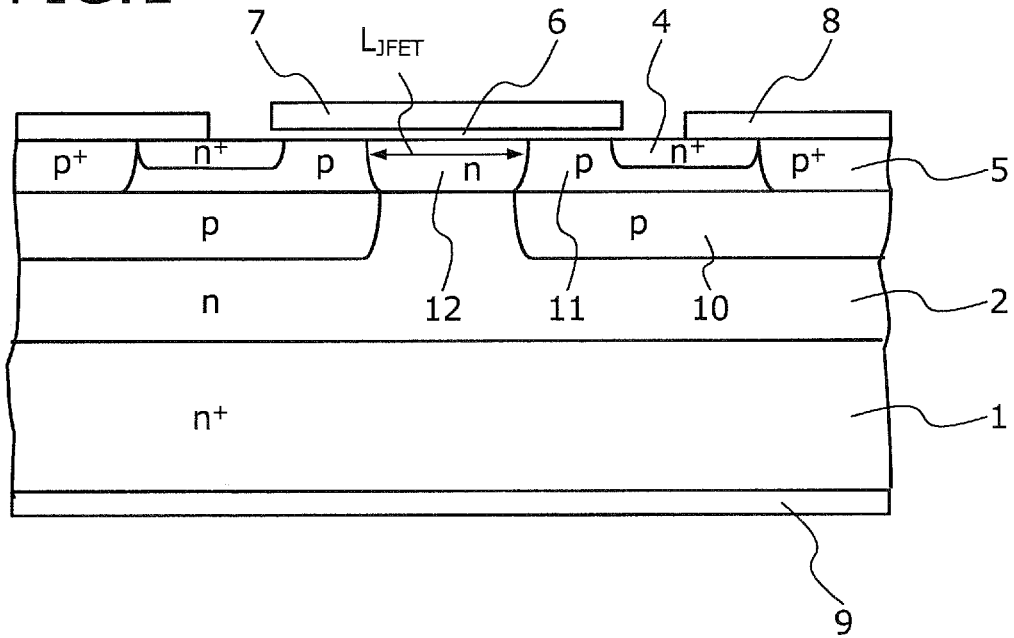
FIG. 1 is a cross-sectional view of the configuration of a MOSFET according to an embodiment of the present invention.

A preferred embodiment of a semiconductor device according to the present invention will be described below in detail with reference to the accompanying drawings. In the accompanying drawings and herein, the layers and the regions each having "n" or "p" attached at the head thereof mean that the majority carriers of each of the layers and the regions respectively are electrons or holes. "+" and "−" attached to "n" and "p" mean that the impurity concentrations are respectively higher and lower than those of the layers and regions without "+" and "−". In the description of the embodiment and the accompanying drawings, the same configurations are given the same reference numerals and redundant description will be omitted.

Embodiment

FIG. 1 is a cross-sectional view of the configuration of a MOSFET according to the embodiment of the present invention. As depicted in FIG. 1, in the MOSFET according to the embodiment of the present invention, an n-type SiC layer (a first conductivity type silicon carbide layer) 2 is formed on a front face of an $n^+$-type SiC substrate (a first conductivity type silicon carbide substrate) 1. The impurity concentration of the n-type SiC layer 2 is lower than the impurity concentration of the $n^+$-type SiC substrate 1. Plural p-type regions (second conductivity type regions) 10 are selectively formed inside the n-type SiC layer 2.

The p-type regions 10 are exposed on the face of the n-type SiC layer 2, on a side opposite to that of the $n^+$-type SiC substrate 1. A p-type SiC layer (a second conductivity type silicon carbide layer) 11 having a concentration that is lower than that of the p-type region 10 is formed covering the surfaces of the n-type SiC layer 2 and the p-type regions 10. An n-type region (a first conductivity type region) 12 penetrating the p-type SiC layer 11 in the depth direction and reaching the n-type SiC layer 2 is formed on the p-type SiC layer 11 on the n-type SiC layer 2 having no p-type region 10 formed therein. The n-type SiC layer 2 and the n-type region 12 are n-type drift regions. The detailed conditions for the impurity concentration and a width $L_{JFET}$ of the n-type region 12 will be described hereinafter.

Inside the p-type SiC layer 11, an $n^+$-type source region (a first conductivity type source region) 4 and a $p^+$-type contact region (a second conductivity type high-concentration region) 5 are formed to contact one another. The $n^+$-type source region 4 and the $p^+$-type contact region 5 are exposed on the face of the p-type SiC layer 11, on the side opposite to that of the n-type SiC layer 2. The $n^+$-type source region 4 is formed away from the n-type region 12. The $p^+$-type contact region 5 is positioned on the side opposite to that of the n-type region 12 of the $n^+$-type source region 4. The impurity concentration of the $p^+$-type contact region 5 is higher than the impurity concentration of the p-type SiC layer 11. The portion excluding the $n^+$-type source region 4, the $p^+$-type contact region 5, and the n-type region 12 in the p-type SiC layer 11 are p-type base regions as well as the p-type regions 10.

A source electrode 8 is formed on the surfaces of the $n^+$-type source region 4 and the $p^+$-type contact region 5. A gate electrode 7 is formed through a gate insulating film 6 on the surfaces of the p-type region 10 and the n-type region 12 between adjacent n-type source regions 4. The gate electrode 7 is electrically insulated from the source electrode 8 by an interlayer insulating film not depicted. A drain electrode 9 in contact with the $n^+$-type SiC substrate 1 is formed on the back face of the $n^+$-type SiC substrate 1.

Operation of the MOSFET according to the embodiment of the present invention will be described. Voltage is applied between the drain and the source such that the potential of the drain electrode 9 is higher than that of the source electrode 8 and thereby, the p-n junction is inversely biased between the p-type region 10 and the n-type SiC layer 2 or between the p-type SiC layer 11 and the n-type region 12. In this state, a depletion layer spreads in the base regions (the p-type regions 10 and the p-type SiC layer 11) and in the drift regions (the n-type SiC layer 2 and the n-type region 12) and therefore, a path (a channel) is blocked for the electrons that are the conductive carriers. Therefore, no drain current flows when the voltage applied to the gate electrode 7 is lower than a gate threshold value. This state is an OFF state.

On the other hand, in the case where voltage is applied between the drain and the source for the potential of the drain electrode 9 to be higher than that of the source electrode 8, when the voltage applied to the gate electrode 7 is set to be equal to or higher than the gate threshold value, free electrons collect on the surface of the p-type SiC layer 11 immediately under the gate electrode 7 to form an inversion layer (a path for the electrons). The $n^+$-type source region 4, and the n-type SiC layer 2 or the n-type region 12 are connected to each other through this inversion layer and therefore, electrons escaping from the $n^+$-type source region 4 pass through the inversion layer, move into the drain region, whereby the drain current flows. This state is an ON state. In this manner, the switching operation of the MOSFET can be controlled by the voltage applied to the gate electrode 7.

Figure 2:
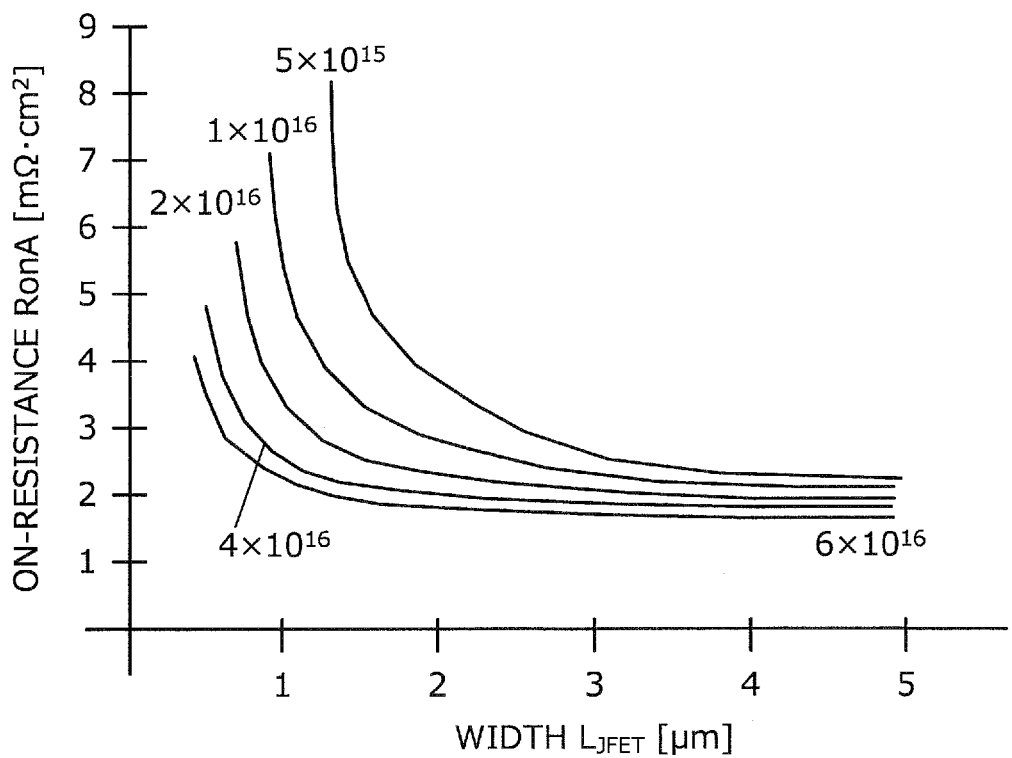
FIG. 2 is a graph of an ON-resistance property of the MOSFET according to the embodiment of the present invention.

Electric properties will be described that are dependent on the impurity concentration and the width $L_{JFET}$ of the n-type region 12. FIG. 2 is a graph of the ON-resistance property of the MOSFET according to the embodiment of the present invention. FIG. 3 is a graph of the breakdown voltage property of the MOSFET according to the embodiment of the present invention. FIG. 4 is a graph of the electric field strength of the MOSFET according to the embodiment of the present invention. In each of FIGS. 2 to 4, the horizontal axis represents the width $L_{JFET}$ of the n-type region 12 and the vertical axis represents the respective electric properties. The values presented in each of the graphs represent the impurity concentration (unit: $cm^{-3}$).

The ON-resistance property of the MOSFET according to the embodiment will be described with reference to FIGS. 2 and 3. FIG. 2 is a graph of simulation results representing the dependence of the ON-resistance on the impurity concentration and the width $L_{JFET}$ of the n-type region 12. FIG. 3 is a graph of simulation results representing the dependence of the breakdown voltage BVdss on the impurity concentration and the width $L_{JFET}$ of the n-type region 12.

It was confirmed from the results depicted in FIG. 2 that the ON-resistance RonA can be lowered as the width $L_{JFET}$ of the n-type region 12 was set to be wider. It was also confirmed that the ON-resistance RonA can be lowered as the impurity concentration of the n-type region 12 is set to be higher. Therefore, it was confirmed that the ON-resistance RonA demonstrated excellent characteristics when the width $L_{JFET}$ of the n-type region 12 is wide and the impurity concentration of the n-type region 12 is high.

On the other hand, it was confirmed from the results depicted in FIG. 3 that the breakdown voltage BVdss can be raised as the width $L_{JFET}$ of the n-type region 12 was set to be narrower. It was also confirmed that the breakdown voltage BVdss can be raised as the impurity concentration of the n-type region 12 was set to be lower. Therefore, it was confirmed that the breakdown voltage BVdss demonstrated excellent characteristics when the width $L_{JFET}$L of the n-type region 12 is narrow and the impurity concentration of the n-type region 12 is low. Therefore, it was confirmed that the breakdown voltage BVdss demonstrated characteristics inverse to the characteristics of the ON-resistance with respect to the width $L_{JFET}$ and the impurity concentration of the n-type region 12.

As described above, the ON-resistance property and the breakdown voltage property are in a trade-off relation and therefore, simultaneous establishment of these properties is necessary. In a MOSFET used as, for example, a switching device, preferably, the ON-resistance usually is 10 mΩ·cm² or less and, preferably, the breakdown voltage BVdss usually is 1,500 V or greater. The reason for this is that the amount of heat generated during an ON-operation is low and the dielectric breakdown tolerance is increased. Therefore, from the results depicted in FIGS. 2 and 3, the low ON-resistance property and the high breakdown voltage property can be substantially established concurrently by forming the n-type region 12 such that the width $L_{JFET}$ of the n-type region 12 is within a range from 0.8 μm to 3.0 μm and the impurity concentration of the n-type region 12 is within a range from $1.0 \times 10^{16}$ cm$^{-3}$ to $5.0 \times 10^{16}$ cm$^{-3}$.

Furthermore, more preferably, the ON-resistance RonA is equal to or lower than 5 mΩ·cm². More preferably, the breakdown voltage BVdss is 1,550 V or greater. The reason for these is that the amount of heat generated during the ON-operation is further reduced and the dielectric breakdown tolerance is further increased. Therefore, from the results depicted in FIGS. 2 and 3, a better low ON-resistance property and a better high breakdown voltage property can be obtained by forming the n-type region 12 such that the width $L_{JFET}$ of the n-type region 12 is in a range from 1.0 μm to 2.0 μm and the impurity concentration of the n-type region 12 is in a range from $2.0 \times 10^{16}$ cm$^{-3}$ to $4.0 \times 10^{16}$ cm$^{-3}$.

The electric field applied to the gate insulating film 6 of the MOSFET according to the embodiment will be described with reference to FIG. 4. FIG. 4 depicts dependence of the electric field strength Eox under the gate insulating film 6 during the OFF-operation, on the impurity concentration and the width $L_{JFET}$ of the n-type region 12. From the results depicted in FIG. 4, it was confirmed that the electric field strength Eox under the gate insulating film 6 decreased as the width $L_{JFET}$ of the n-type region 12 decreased and the impurity concentration of the n-type region 12 decreased.

Therefore, from the results depicted in FIGS. 2 to 4, it was confirmed that the low ON-resistance property and the high breakdown voltage property can be substantially established concurrently and the electric field strength Eox under the gate insulating film 6 can be reduced by setting the width LJFET of the n-type region 12 to be narrower within a range from 0.8 μm to 3.0 μm and the impurity concentration of the n-type region 12 to be a low concentration within a range from $1.0 \times 10^{16}$ cm$^{-3}$ to $5.0 \times 10^{16}$ cm$^{-3}$.

As described above, according to the embodiment, the low ON-resistance property and the high breakdown voltage property can be substantially established concurrently and no high electric field is applied to the gate oxide film by setting the width of the portion (the n-type region 12) in contact with the gate insulating film of the n-type SiC layer to be narrower within a range from 0.8 μm to 3.0 μm and the impurity concentration thereof to be a low concentration within a range from $1.0 \times 10^{16}$ cm$^{-3}$ to $5.0 \times 10^{16}$ cm$^{-3}$. Therefore, the dielectric breakdown tolerance of the gate insulating film can be improved and thereby, the reliability of the gate insulating film can be improved.

In the description, the present invention is applicable to various semiconductor devices each including the MOS structure. Although the first conductivity type is set to be the n type and the second conductivity type is set to be the p type in the embodiment, the present invention is also achieved when the first conductivity type is set to be the p type and the second conductivity type is set to be the n type.

INDUSTRIAL APPLICABILITY

As described above, the semiconductor device according to the present invention is useful for a semiconductor device used as a switching device.

EXPLANATIONS OF LETTERS OR NUMERALS

1 n$^+$-type silicon carbide substrate
2 n-type silicon carbide layer
4 n$^+$-type source region
5 p$^+$-type contact region
6 gate insulating film
7 gate electrode
8 source electrode
9 drain electrode
10 p-type region
11 p-type silicon carbide layer
12 n-type region

The invention claimed is:
1. A semiconductor device comprising:
a first conductivity type silicon carbide substrate;
a first conductivity type silicon carbide layer formed on a surface of the first conductivity type silicon carbide substrate, and having an impurity concentration that is lower than that of the first conductivity type silicon carbide substrate;
a second conductivity type region selectively formed inside the first conductivity type silicon carbide layer;
a second conductivity type silicon carbide layer formed on surfaces of the first conductivity type silicon carbide layer and the second conductivity type region, and having an impurity concentration that is lower than that of the second conductivity type region;
a first conductivity type region selectively formed inside the second conductivity type silicon carbide layer, penetrating the second conductivity type silicon carbide layer in a depth direction, and in contact with the first conductivity type silicon carbide layer;
a first conductivity type source region formed inside the second conductivity type silicon carbide layer;
a second conductivity type high-concentration region formed inside the second conductivity type silicon carbide layer and disposed on a side opposite to that of the first conductivity type region of the first conductivity type source region;
a source electrode electrically connected to the second conductivity type high-concentration region and the first conductivity type source region;

a gate electrode formed through a gate insulating film on a surface of a portion between the first conductivity type source region and the first conductivity type region in the second conductivity type silicon carbide layer, spanning from the first conductivity type source region to the first conductivity type region;

a drain electrode formed on a back face of the first conductivity type silicon carbide substrate, wherein an impurity concentration of the first conductivity type region is greater than $1.0 \times 10^{16}$ cm$^{-3}$ and less than or equal to $5.0 \times 10^{16}$ cm$^{-3}$, a width of the first conductivity type region is within a range from 0.8 μm to 3.0 μm;

the second conductivity type silicon carbide layer directly underlies the first conductivity type source region; and the second conductivity type silicon carbide layer extends to the same length as the second conductivity type region adjacent to the first conductivity type region.

2. The semiconductor device of claim 1, wherein the impurity concentration of the first conductivity type region is within a range from $2.0 \times 10^{16}$ cm$^{-3}$ to $4.0 \times 10^{16}$ cm$^{-3}$, and the width of the first conductivity type region is within a range from 1.0 μm to 2.0 μm.

3. The semiconductor device of claim 1, wherein the width of the first conductivity type region is within a range from 2.0 μm to 3.0 μm.

\* \* \* \* \*